United States Patent [19]

Egger

[11] 4,408,162
[45] Oct. 4, 1983

[54] SENSITIVITY NMR PROBE

[75] Inventor: Herman Egger, Palo Alto, Calif.

[73] Assignee: Varian Associates, Inc., Palo Alto, Calif.

[21] Appl. No.: 219,287

[22] Filed: Dec. 22, 1980

[51] Int. Cl.³ .......................................... G01R 33/08
[52] U.S. Cl. .................................... 324/318; 324/311
[58] Field of Search ................ 324/300, 311, 318, 322

[56] References Cited

U.S. PATENT DOCUMENTS

| 4,051,429 | 9/1977 | Imanari et al. | 324/311 |
| 4,093,911 | 6/1978 | Hill et al. | 324/322 |
| 4,095,168 | 6/1978 | Hlavka | 324/310 |

OTHER PUBLICATIONS

"Fourier Transform NMR Spectroscopy", Derek Shaw, Elsevier Sci. Pub. Co., 1976, pp. 128-131.

Primary Examiner—Michael J. Tokar
Attorney, Agent, or Firm—Stanley Z. Cole; Edward H. Berkowitz

[57] ABSTRACT

In an NMR probe containing an observe coil and a decoupling coil, the signal-to-noise ratio of the observe channel is improved by inserting a back-to-back parallel combination of diodes in series with the decoupling coil to present an infinite impedance in the decoupling channel in its passive state for induced RF signals from the observe coil.

3 Claims, 1 Drawing Figure

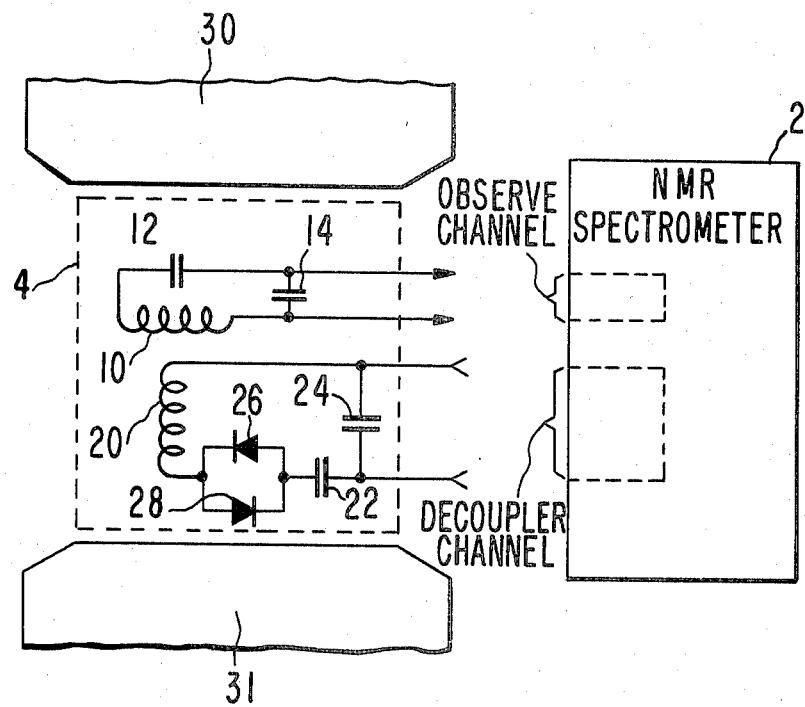

SENSITIVITY NMR PROBE

BACKGROUND OF THE INVENTION

The present invention is in the field of nuclear magnetic resonance spectroscopy instrumentation and relates particularly to the rf probe structure of such instruments.

The practice of radio frequency resonance spectroscopy can be regarded as inclusion in an rf circuit of a class of reactive components which are distinguished physically by quantum mechanical characteristics. Manipulating and detecting quantum transitions of magnetic moments of nuclei, electrons, atoms and molecules has proven to be an abundant source of powerful analytic techniques.

The coupling of excitation and detection portions of the apparatus to the sample is accomplished in the probe. The basic apparatus of the probe comprises an inductive coupling means for transferring energy to or from the sample quantum system under study. A variety of functions are accomplished in the probe apart from excitation of the resonance conditions and detection thereof. For example, the decoupling of interacting magnetic moments of gyromagnetically resonant structures and substructures is often accomplished by irradiating the system with appropriately tuned saturing rf radiation. Furthermore, the separate excitation and detection of a precisely known gyromagnetic resonance is often undertaken concurrently or in a time sharing mode in order to establish a field frequency relationship for instrument stabilization. In various probes of the prior art, several of these functions have been accommodated in common inductive structures with appropriate multiplexing. In other prior art probes, specialization of function has resulted in a multiplicity of substructures and circuits within the probe. Moreover, probe structures often contain additional mechanical apparatus for spinning the sample at high rotational frequencies within the magnetic field. This subject is outside the scope of the present invention.

The present invention is directed to a probe structure which includes an observe coil for exciting and detecting resonance and a decoupler coil for destroying the interaction of the magnetic moments of selected interacting quantum systems. These coils are perforce in close physical proximity with the result that a small portion of the resonant rf signal induced in the observe coil is coupled into tuned circuit of the decoupler coil where this small portion of the rf signal is then dissipated. The loss of this portion of the signal degrades the signal-to-noise ratio at the input of the observe signal preamplifier.

Although the decoupler coil is nominally passive during the observe phase of the experiment, it remains present as a passive tuned finite impedance inductively coupled to the observe coil.

It is an object of the present invention to achieve an enhanced signal-to-noise ratio in the observe channel of a two-coil rf probe of an NMR spectrometer.

In one feature of the invention, the decoupler coil is connected in series with a pair of rf diodes, the latter connected back-to-back.

In another feature of the present invention, the rf diodes are selected such that the small signal derived from coupling a portion of the observe coil signal into the decoupler coil is insufficient to turn on the diode.

BRIEF DESCRIPTION OF THE DRAWINGS

FIG. 1 is a schematic illustration of the salient aspects of the present invention.

DETAILED DESCRIPTION OF THE INVENTION

In conjunction with an NMR spectrometer 2, an rf probe 4 comprising an observe coil 10 and a decoupler coil 20 are located within the probe of an NMR spectrometer. The circuits to which the respective coils are connected are independent. Capacitors 12 and 14, in series and parallel respectively, with the observe coil may be regarded as expressive of the tuning and dc isolation in the observe channel. Similarly, capacitors 22 and 24 enjoy a similar role in the decoupling channel. Typically the frequency separation and the response of these tuned circuits may be of the order of 6% as in the case of decoupling hydrogen nuclei from fluorine nuclei or where the frequencies may be almost identical as in the case of homonuclear decoupling. Consequently, when the circuit of observe coil 10 is resonating with the resonant free induction decay signal, a small portion may be coupled into the tuned circuit of a near passive decoupler coil 20. This parasitic effect is exacerbated by the close proximity of coils 10 and 20 within the probe 4 which proximity is required by the disposition of the probe within a region of homogeneous magnetic fields (provided by poles 30, 31 of a magnet or the equivalent interior of a solenoid). In the preferred embodiment of the invention, a pair of rf diodes 26 and 28 are connected together in opposite sense, in series with decoupler coil 20. The choice of diode is of quite wide latitude within the constraints indicated below. A typical choice is MBD 501. During the observe phase of an experiment, the signal induced in the decoupler coil is of insufficient magnitude to turn on diodes 26 and 28. Consequently, the decoupler channel appears as an open circuit and there is no dissipation of the signal coupled into the decoupler coil from the observe coil. Indeed, there now is little or no loss to the decoupler channel from the observe coil.

During the decoupling phase of an experiment, the large rf signal applied to the decoupler coil raises the two diodes to saturation and the decoupler channel operates in its usual manner.

I claim:
1. An NMR spectrometer comprising:
   a probe;
   a receive channel further comprising a receive coil within said probe;
   a decoupler channel further comprising a decoupler coil within said probe and disposed in proximity to said receive coil, said decoupler connected in series with a pair of RF diodes, said diodes connected cathode-to-anode, whereby said decoupler circuit is an open circuit for sufficiently small signals coupled in said decoupler circuit from said receive coil.
2. The apparatus of claim 1 wherein said receive channel within said probe comprises a tuned circuit including said receive coil and said decoupler channel within said probe comprises a tuned circuit including said decoupler coil.
3. The apparatus of claim 2 wherein said rf diodes present substantially vanishing impedance to an rf signal supplied to said decoupler circuit from a source external to said probe.

* * * * *